(12) United States Patent
Kobayashi et al.

(10) Patent No.: US 7,457,996 B2
(45) Date of Patent: Nov. 25, 2008

(54) SEMICONDUCTOR INTEGRATED CIRCUIT CAPABLE OF TESTING WITH SMALL SCALE CIRCUIT CONFIGURATION

(75) Inventors: Soichi Kobayashi, Hyogo (JP);
Yoshiaki Yamazaki, Hyogo (JP);
Yukihiko Shimazu, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 497 days.

(21) Appl. No.: 10/632,928

(22) Filed: Aug. 4, 2003

(65) Prior Publication Data

US 2004/0184328 A1    Sep. 23, 2004

(30) Foreign Application Priority Data

Mar. 18, 2003    (JP)    ............ 2003-073951

(51) Int. Cl.
*G11C 29/00*    (2006.01)
*G11C 7/00*    (2006.01)

(52) U.S. Cl. ............... 714/718; 365/201
(58) Field of Classification Search ......... 714/718–723, 714/710; 365/225, 200–201
See application file for complete search history.

(56) References Cited

U.S. PATENT DOCUMENTS

| | | | | |
|---|---|---|---|---|
| 4,245,299 A * | 1/1981 | Woods et al. | ............... | 713/601 |
| 6,324,106 B2 * | 11/2001 | Urakawa | ............... | 365/200 |
| 6,538,929 B2 * | 3/2003 | Hiraki et al. | ............ | 365/189.05 |
| 6,590,816 B2 * | 7/2003 | Perner | ............... | 365/200 |
| 6,871,297 B2 * | 3/2005 | Puri et al. | ............... | 714/30 |
| 2001/0042231 A1 * | 11/2001 | Kawamata | ............... | 714/719 |

FOREIGN PATENT DOCUMENTS

| | | |
|---|---|---|
| JP | 1-224998 A | 9/1989 |
| JP | 04-229499 | 8/1992 |
| JP | 10-239398 | 9/1998 |
| JP | 11-203893 | 7/1999 |
| JP | 2000-048591 | 2/2000 |
| JP | 2000-339229 A | 12/2000 |
| JP | 2001-273787 | 10/2001 |
| JP | 2001-273798 | 10/2001 |
| JP | 2003-178600 | 6/2003 |
| JP | 2003-346500 | 12/2003 |

OTHER PUBLICATIONS

Notice of Grounds of Rejection in JP 2003-073951 dated Jul. 8, 2008, and Translation thereof.

* cited by examiner

*Primary Examiner*—Cynthia Britt
(74) *Attorney, Agent, or Firm*—Buchanan Ingersoll & Rooney PC

(57) ABSTRACT

In a test mode, a comparator compares for each column a value of data read from each memory cell connected to an activated word line with an expected value to be read from each memory cell. An error register holds error data based on a comparison result by a comparator. Each bit of the error data indicates the comparison result by the comparator for a corresponding column. Each bit is set to "0" when the comparison result for the corresponding column always indicates equality whichever word line is activated, and is set to "1" when once the comparison result for the corresponding column indicates difference.

7 Claims, 9 Drawing Sheets

FIG.2

| DEFECTIVE COLUMN | REPAIR CODE | | | | | |
|---|---|---|---|---|---|---|
| | C0 | C1 | C2 | C3 | C4 | C5 |
| NONE | 0 | 0 | 0 | 0 | 0 | 0 |
| 0 | 0 | 0 | 0 | 0 | 0 | 1 |
| 1 | 0 | 0 | 0 | 0 | 1 | 1 |
| 2 | 0 | 0 | 0 | 1 | 0 | 1 |
| 3 | 0 | 0 | 0 | 1 | 1 | 1 |
| 4 | 0 | 0 | 1 | 0 | 0 | 1 |
| 5 | 0 | 0 | 1 | 0 | 1 | 1 |
| 6 | 0 | 0 | 1 | 1 | 0 | 1 |
| 7 | 0 | 0 | 1 | 1 | 1 | 1 |
| 8 | 0 | 1 | 0 | 0 | 0 | 1 |
| 9 | 0 | 1 | 0 | 0 | 1 | 1 |
| 10 | 0 | 1 | 0 | 1 | 0 | 1 |
| 11 | 0 | 1 | 0 | 1 | 1 | 1 |
| 12 | 0 | 1 | 1 | 0 | 0 | 1 |
| 13 | 0 | 1 | 1 | 0 | 1 | 1 |
| 14 | 0 | 1 | 1 | 1 | 0 | 1 |
| 15 | 0 | 1 | 1 | 1 | 1 | 1 |
| 16 | 1 | 0 | 0 | 0 | 0 | 1 |
| 17 | 1 | 0 | 0 | 0 | 1 | 1 |
| 18 | 1 | 0 | 0 | 1 | 0 | 1 |
| 19 | 1 | 0 | 0 | 1 | 1 | 1 |
| 20 | 1 | 0 | 1 | 0 | 0 | 1 |
| 21 | 1 | 0 | 1 | 0 | 1 | 1 |
| 22 | 1 | 0 | 1 | 1 | 0 | 1 |
| 23 | 1 | 0 | 1 | 1 | 1 | 1 |
| 24 | 1 | 1 | 0 | 0 | 0 | 1 |
| 25 | 1 | 1 | 0 | 0 | 1 | 1 |
| 26 | 1 | 1 | 0 | 1 | 0 | 1 |
| 27 | 1 | 1 | 0 | 1 | 1 | 1 |
| 28 | 1 | 1 | 1 | 0 | 0 | 1 |
| 29 | 1 | 1 | 1 | 0 | 1 | 0 |
| 30 | 1 | 1 | 1 | 1 | 0 | 1 |
| 31 | 1 | 1 | 1 | 1 | 1 | 1 |

FIG.4

| FUSE ELEMENT | REPAIR CODE BIT |
|---|---|
| F0:NOT-DISCONNECTED<br>F0:DISCONNECTED | C0=0<br>C0=1 |
| F1:NOT-DISCONNECTED<br>F1:DISCONNECTED | C1=0<br>C1=1 |
| F2:NOT-DISCONNECTED<br>F2:DISCONNECTED | C2=0<br>C2=1 |
| F3:NOT-DISCONNECTED<br>F3:DISCONNECTED | C3=0<br>C3=1 |
| F4:NOT-DISCONNECTED<br>F4:DISCONNECTED | C4=0<br>C4=1 |
| F5:NOT-DISCONNECTED<br>F5:DISCONNECTED | C5=0<br>C5=1 |

FIG.5

| STATES OF FUSE ELEMENTS F0 F1 F2 F3 F4 F5 | SPARE SELECTOR CONTROL SIGNAL [0:31] (SPARE DECODER OUTPUT VALUE) |
|---|---|
| 0 0 0 0 0 0 | 0000 0000 0000 0000 0000 0000 0000 0000 |
| 0 0 0 0 0 1 | 1111 1111 1111 1111 1111 1111 1111 1111 |
| 0 0 0 0 1 1 | 0111 1111 1111 1111 1111 1111 1111 1111 |
| 0 0 0 1 0 1 | 0011 1111 1111 1111 1111 1111 1111 1111 |
| 0 0 0 1 1 1 | 0001 1111 1111 1111 1111 1111 1111 1111 |
| 0 0 1 0 0 1 | 0000 1111 1111 1111 1111 1111 1111 1111 |
| 0 0 1 0 1 1 | 0000 0111 1111 1111 1111 1111 1111 1111 |
| 0 0 1 1 0 1 | 0000 0011 1111 1111 1111 1111 1111 1111 |
| 0 0 1 1 1 1 | 0000 0001 1111 1111 1111 1111 1111 1111 |
| 0 1 0 0 0 1 | 0000 0000 1111 1111 1111 1111 1111 1111 |
| 0 1 0 0 1 1 | 0000 0000 0111 1111 1111 1111 1111 1111 |
| 0 1 0 1 0 1 | 0000 0000 0011 1111 1111 1111 1111 1111 |
| 0 1 0 1 1 1 | 0000 0000 0001 1111 1111 1111 1111 1111 |
| 0 1 1 0 0 1 | 0000 0000 0000 1111 1111 1111 1111 1111 |
| 0 1 1 0 1 1 | 0000 0000 0000 0111 1111 1111 1111 1111 |
| 0 1 1 1 0 1 | 0000 0000 0000 0011 1111 1111 1111 1111 |
| 0 1 1 1 1 1 | 0000 0000 0000 0001 1111 1111 1111 1111 |
| 1 0 0 0 0 1 | 0000 0000 0000 0000 1111 1111 1111 1111 |
| 1 0 0 0 1 1 | 0000 0000 0000 0000 0111 1111 1111 1111 |
| 1 0 0 1 0 1 | 0000 0000 0000 0000 0011 1111 1111 1111 |
| 1 0 0 1 1 1 | 0000 0000 0000 0000 0001 1111 1111 1111 |
| 1 0 1 0 0 1 | 0000 0000 0000 0000 0000 1111 1111 1111 |
| 1 0 1 0 1 1 | 0000 0000 0000 0000 0000 0111 1111 1111 |
| 1 0 1 1 0 1 | 0000 0000 0000 0000 0000 0011 1111 1111 |
| 1 0 1 1 1 1 | 0000 0000 0000 0000 0000 0001 1111 1111 |
| 1 1 0 0 0 1 | 0000 0000 0000 0000 0000 0000 1111 1111 |
| 1 1 0 0 1 1 | 0000 0000 0000 0000 0000 0000 0111 1111 |
| 1 1 0 1 0 1 | 0000 0000 0000 0000 0000 0000 0011 1111 |
| 1 1 0 1 1 1 | 0000 0000 0000 0000 0000 0000 0001 1111 |
| 1 1 1 0 0 1 | 0000 0000 0000 0000 0000 0000 0000 1111 |
| 1 1 1 0 1 0 | 0000 0000 0000 0000 0000 0000 0000 0111 |
| 1 1 1 1 0 1 | 0000 0000 0000 0000 0000 0000 0000 0011 |
| 1 1 1 1 1 1 | 0000 0000 0000 0000 0000 0000 0000 0001 |

SEMICONDUCTOR INTEGRATED CIRCUIT CAPABLE OF TESTING WITH SMALL SCALE CIRCUIT CONFIGURATION

BACKGROUND OF THE INVENTION

1. Field of the Invention

The present invention relates to a semiconductor integrated circuit, and more particularly to a semiconductor integrated circuit having a test function.

2. Description of the Background Art

A semiconductor integrated circuit containing a redundancy circuit (a spare memory) has conventionally been known.

Japanese Patent Laying-Open No. 1-224998, for example, discloses a semiconductor integrated circuit including a memory array having a decoder, a first control circuit generating an address, a read/write control signal, write data, read expected data in response to a control clock when a test mode is set by an external control pin, a first comparator comparing a result of reading the memory array with the read expected value data, an address register storing a corresponding address when an output of the first comparator indicates disagreement, a second comparator comparing an address in the address register with an external address in a normal operation, and a second control circuit switching between the memory array and the spare memory to be accessed in accordance with an output result of the second comparator.

The aforementioned Japanese Patent Laying-Open No. 1-224998, however, has the following problems.

First, address registers are required by the number of redundancy circuits. This results in a larger scale of the semiconductor integrated circuit.

Furthermore, when the number of errors, that is, the number of times the read result differs from the read expected values is larger than the number of redundancy circuits, the addresses causing the excessive errors cannot be stored in the address register and therefore all of the locations of the memory cells causing errors cannot be specified.

SUMMARY OF THE INVENTION

An object of the present invention is to provide a semiconductor integrated circuit performing a test that allows a location of a memory cell with an error to be specified even when the number of errors is larger than the number of redundancy circuits, without increasing a circuit scale.

A semiconductor integrated circuit in accordance with an aspect of the present invention includes a comparator comparing a value of data read from each memory cell connected to an activated word line with an expected value to be read from each memory cell for each column in a test mode, and an error register accumulatively holding error data based on a comparison result by the comparator. Each bit of the error data indicates a comparison result by the comparator for a corresponding column. Each bit takes a first logical value when the comparison result for the corresponding column always indicates equality whichever word line is activated, and each bit takes a second logical value when once the comparison result for the corresponding column indicates difference.

In the semiconductor integrated circuit in accordance with the present invention, a test can be performed that allows all the locations of memory cells causing errors (that is, which column a memory cell belong to) to be specified even when the number of errors is larger than the number of redundancy circuits, without increasing a circuit scale.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a table showing correspondences between defective columns and repair codes.

FIG. 4 is a table showing correspondences between states of fuse elements and bits of the repair codes.

FIG. 5 is a table showing correspondences between the states of the fuse elements and spare selector control signals.

DESCRIPTION OF THE PREFERRED EMBODIMENTS

In the following, embodiments of the present invention will be described with reference to the figures.

First Embodiment

The present embodiment relates to a memory test in a semiconductor integrated circuit including two modules.

(Configuration)

Figure 1:
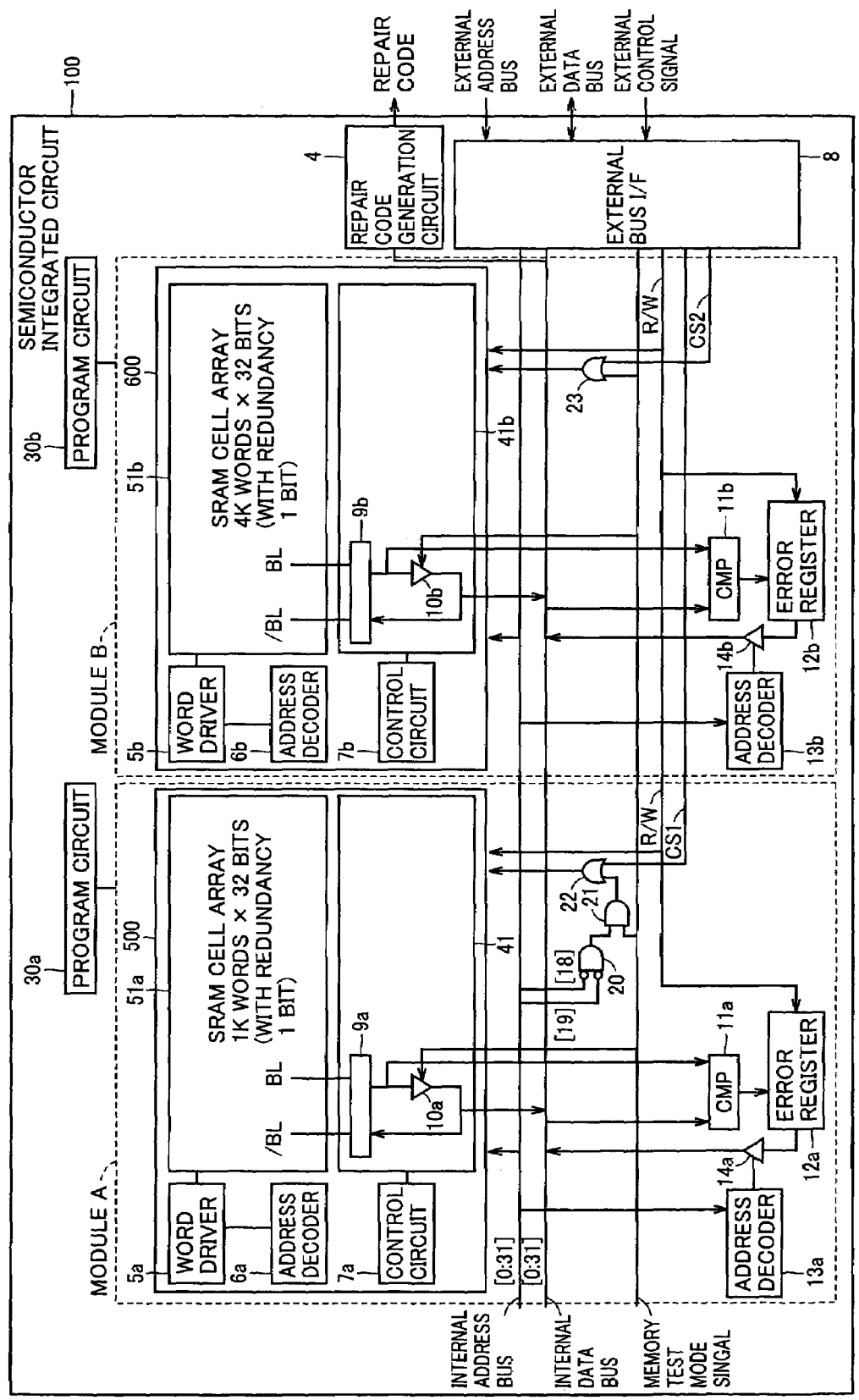
FIG. 1 is a diagram showing a configuration of a semiconductor integrated circuit in accordance with a first embodiment.

FIG. 1 shows a configuration of a semiconductor integrated circuit in accordance with a first embodiment. Referring to FIG. 1, a semiconductor integrated circuit 100 includes two modules A and B, an external bus I/F8, and a repair code generation circuit 4. Two modules A and B are connected to a common internal address bus and to a common internal data bus and have their operations controlled by their respective chip select signals in a normal operation.

(Module A)

Module A includes an SRAM (Static Random Access Memory) cell array 51a, a gate circuit 41a, a word driver 5a, an address decoder 6a, a control circuit 7a, a comparator (CMP) 11a, an error register 12a, an address decoder 13a, a tristate buffer 14a, an NOR circuit 20, an AND circuit 21, an OR circuit 22, and a program circuit 30a.

SRAM cell array 51a includes memory cells arranged in columns and rows with 33 memory cells in the column direction and 1K memory cells in the row direction. Here, one column is provided for a redundancy circuit. In order to select a memory cell within SRAM cell array 51a, 1K word lines and 33 bit line pairs are provided.

Address decoder 6a includes a row decoder and a column decoder.

The row decoder specifies a word line to be activated in accordance with a row address formed of a prescribed plurality of bits of a 32-bit address signal passed through the internal address bus.

The column decoder selects a column in accordance with a column address formed of a prescribed plurality of bits of a 32-bit address signal passed through the internal address bus. The column decoder selects all the columns irrespective of a value of a column address in a memory test mode.

The externally applied address signal is provided so as to select SRAM cell array 51*b* of the SRAM cell arrays in the two modules which is larger in the size of the row direction. More specifically, the 18th through 29th bits of the 32-bit address can be used to specify 4K word lines of SRAM cell array 51*b* in module B described later. In other words, the address signal changes from 32'b0000 0000 0000 0000 0000 0000 0000 0000 to 32'b0000 0000 0000 0000 0011 1111 1111 1100. (In this representation, the least significant bit (LSB) is placed on the left side and the most significant bit (MSB) is placed on the right side.) In module A, the 18th and 19th bits of the address signal are not used since the number of word lines of SRAM cell array 51*a* is 1K in module A.

Word driver 5*a* activates a word line corresponding to a row address specified by address decoder 6*a*.

Address decoder 13*a* outputs a signal that is set to "1" (asserted) when an address signal has a prescribed value.

Tritstate buffer 14*a* outputs error data held in error register 12*a* through the internal data bus to external bus I/F8 and to repair code generation circuit 4 when a signal output from address decoder 13*a* is set to "1" (asserted).

Gate circuit 41*a* includes for each column, that is, for each bit line pair, an input/output circuit 9*a* and a tristate buffer 10*a*.

Input/output circuit 9*a* sends write data sent through the internal address bus to a bit line pair in a writing operation, and amplifies and outputs data on the bit line pair as read data to tristate buffer 10*a* and comparator 11*a* in a reading operation.

Tristate buffer 10*a* is a kind of switch circuit, which does not output the read data output from input/output circuit 9*a* to the internal data bus when the memory test mode signal is "1" (asserted), and outputs the read data output from input/output circuit 9*a* to the internal data bus when the memory test mode signal is "0" (negated). Therefore, the read data read from a memory cell is not output to the internal data bus in the memory test mode. Considering that data is simultaneously read from a memory cell in the other module B in the memory test mode, collision of read data from both modules in the internal data bus is thus prevented.

In the memory test mode, the memory test mode signal is set to "1" (asserted) in accordance with the external control signal. On the other hand, in the normal mode, chip select signal CS1 is set to "1" (asserted) when module A is selected in accordance with the external control signal.

Through NOR circuit 20, AND circuit 21, and OR circuit 22, when the memory test mode signal is "1" (asserted) and the 18th bit and the 19th bit of the address signal both are "0", or when chip select signal CS1 is "1" (asserted), the asserted signal is passed from OR circuit 22 to control circuit 7*a*.

Control circuit 7*a* controls writing of data to SRAM cell array 51*a* and reading of data from SRAM cell array 51*a*. Control circuit 7*a* allows a data writing or reading operation to/from SRAM cell array 51*a* only when the signal from OR circuit 22 is asserted. Therefore, in the memory test mode, data is written into or read from SRAM cell array 51*a* irrespective of a value of chip select signal CS1.

Therefore, in module A, where the memory test mode signal is "1" (asserted), the reading or writing operation is performed only when the 18th and 19th bits of the address signal are set to "00", and the reading or writing operation is not performed when the 18th and 19th bits of the address signal are set to "01", "10" or "11". This prevents the same word line from being activated at different times in the memory test mode.

Comparator 11*a* has one input externally receiving a 32-bit expected value through the internal data bus. A value of each bit of the received expected value results when data is correctly read from a column corresponding to that bit. Comparator 11*a* has the other input receiving read data from 32 columns of SRAM cell array 51*a*. Comparator 11*a* makes a comparison between an expected value and read data for each column, that is, bit by bit.

Error register 12*a* holds 32-bit error data based on a comparison result. Each bit of the error data indicates a comparison result for a corresponding column. Each bit is set to "0" if the comparison result indicates equality whichever word line is activated, and is set to "1" if the comparison result indicates difference when any one of the word lines is activated.

(Module B)

Module B has a configuration generally similar to module A. It is noted that SRAM cell array 51*b* of module B includes 4K memory cells in the row direction and 33 memory cells in the column direction. Here, one column is provided for a redundancy circuit. In order to select a memory cell within SRAM cell array 51*b*, 4K word lines and 33 bit line pairs are provided.

Module B does not include NOR circuit 20, AND circuit 21, and OR circuit 22, but includes an OR circuit 23.

In the memory test mode, the memory test mode signal is set to "1" (asserted) in accordance with the external control signal. On the other hand, in the normal mode, chip select signal CS2 is set to "1" (asserted) when module B is selected in accordance with the external control signal. OR circuit 23 outputs to control circuit 7*b* a signal to be asserted when the memory test mode signal is "1" (asserted) or when chip select signal CS2 is "1" (asserted).

Control circuit 7*b* controls writing of data to SRAM cell array 51*b* and reading of data from SRAM cell array 51*b*. Control circuit 7*b* allows writing or reading of data to or from SRAM cell array 51*b* only when a signal output from OR circuit 23 is asserted. Therefore, in the memory test mode, data is written into or read from SRAM cell array 51*b* irrespective of a value of chip select signal CS2.

External bus I/F8 outputs an externally applied address signal to the internal address bus and outputs externally applied data to the internal data bus, and it also outputs the data sent through the internal data bus to the outside and outputs an externally applied control signal to a component in connection with that control signal.

Repair code generation circuit 4 specifies one defective column based on 32-bit error data sent from error registers 12*a*, 12*b* through the data bus and generates a 6-bit repair code. Each bit of the 6-bit repair code is C0, C1, C2, C3, C4 and C5 in the order from the lower bit. Repair code generation circuit 4 selects one defective column and generates a repair code when there are a plurality of defective columns. FIG. 2 shows correspondences between the defective columns and the repair codes. Thus, a defect repair can be performed using error data that is a memory test result held in error registers 12*a*, 12*b*.

(Configuration Concerning Defect Repair)

Figure 3:
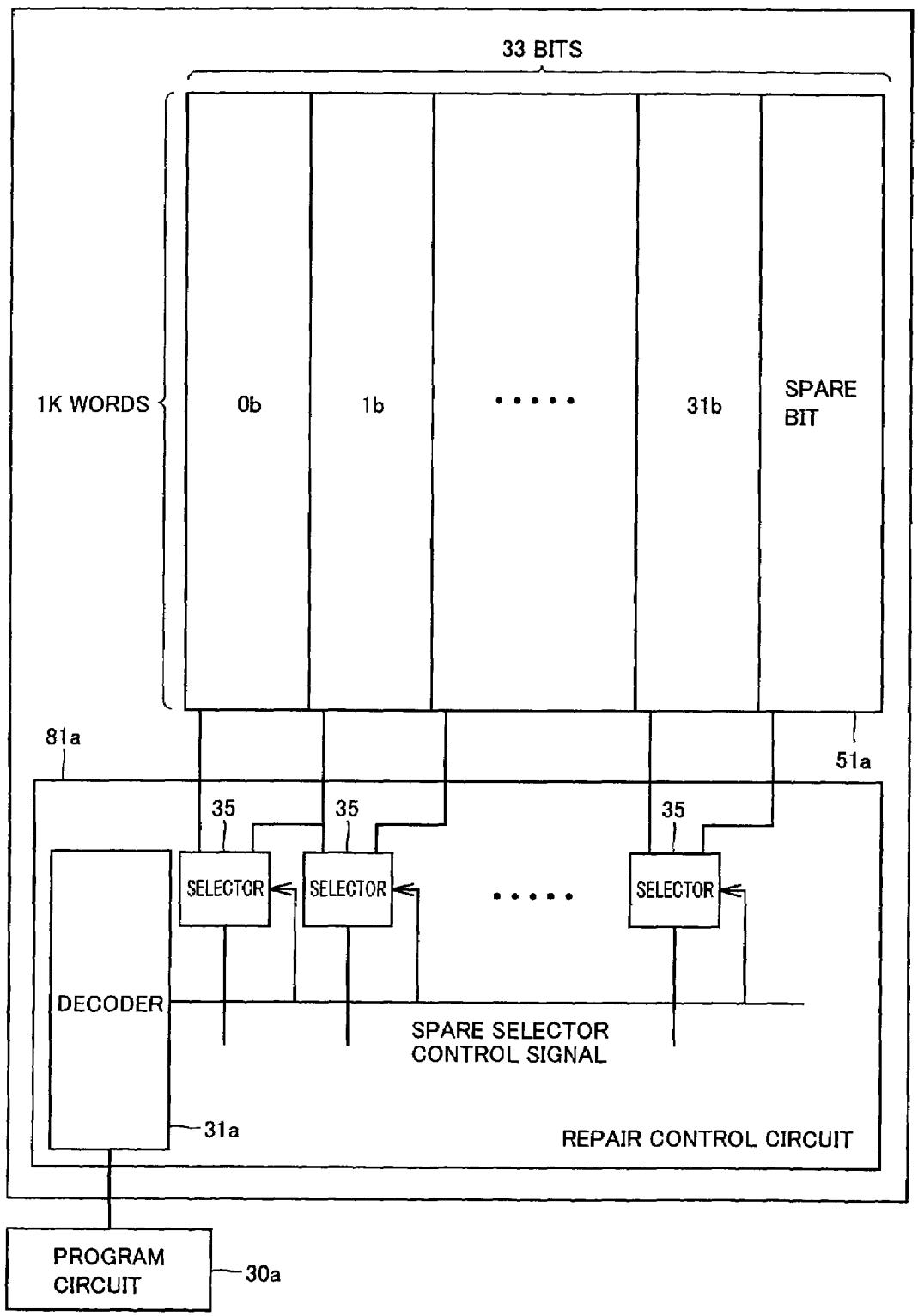
FIG. 3 is a diagram showing a configuration in connection with a defect repair.

FIG. 3 shows those components in the semiconductor integrated circuit which are in connection with the defect repair.

Although FIG. 3 only shows the circuitry for the defect repair for module A, similar circuitry can be employed for module B. SRAM cell array 51a is an SRAM cell array with column redundancy and has one spare column.

Program circuit 30a includes six fuse elements F0, F1, F2, F3, F4, and F5, and outputs a 6-bit repair code corresponding to the setting states of the fuse elements. FIG. 4 shows correspondences between the states of the fuse elements and the bits of the repair code. For example, when fuse element F0 is in a not-disconnected state, a bit C0 of the repair code is set to "0", and when fuse element F0 is in a disconnected state, the bit C0 of the repair code is set to "1".

Decoders 31a and thirty-two selectors 35 constitute a repair control circuit 81a. This repair control circuit 81a controls a repair for a defective memory cell array.

Decoder 31a outputs a 32-bit spare selector control signal in accordance with a 6-bit repair code output from program circuit 30a.

FIG. 5 shows correspondences between the states of the fuse elements in program circuit 30a and the spare select control signal. For example, if the 30th column is defective, the states of fuse elements F0, F1, F2, F3, F4, and F5 set in program circuit 30 are 1, 1, 1, 1, 0, 1, respectively. Here, the state "0" specifies non-disconnection, and the state "1" specifies disconnection. Program circuit 30a outputs repair code 6'b111101 in accordance with the states of the fuse elements. Decoder 31 generates a spare selector control signal of 32'b0000 0000 0000 0000 0000 0000 0000 0011 in accordance with the states of the fuse elements, based on the correspondence table shown in FIG. 5.

Selector 35 is provided corresponding to each column and receives a spare selector control signal. Selector 35 connects a bit line pair of a corresponding column to a corresponding input/output circuit 9a if a corresponding bit of the spare select control signal is "0", and selector 35 connects the bit line pair of the next column to the right to the corresponding input/output circuit 9a if the corresponding bit is "1".

According to the correspondence table in FIG. 5, if the Kth column is defective, the selectors corresponding to the Kth to the 31st columns select the (K+1)th to 31st columns and spare columns, respectively. For example, when a spare selector control signal of 32'b0000 0000 0000 0000 0000 0000 0000 0011 is input, the selector corresponding to the nth (n=0-29) column selects the nth (n=0-29) column. The selector corresponding to the 30th column selects the 31st column. The selector corresponding to the 31st column selects a spare column. Therefore, data is neither written into nor read from the defective, 30th column.

(Operation)

Figure 6:
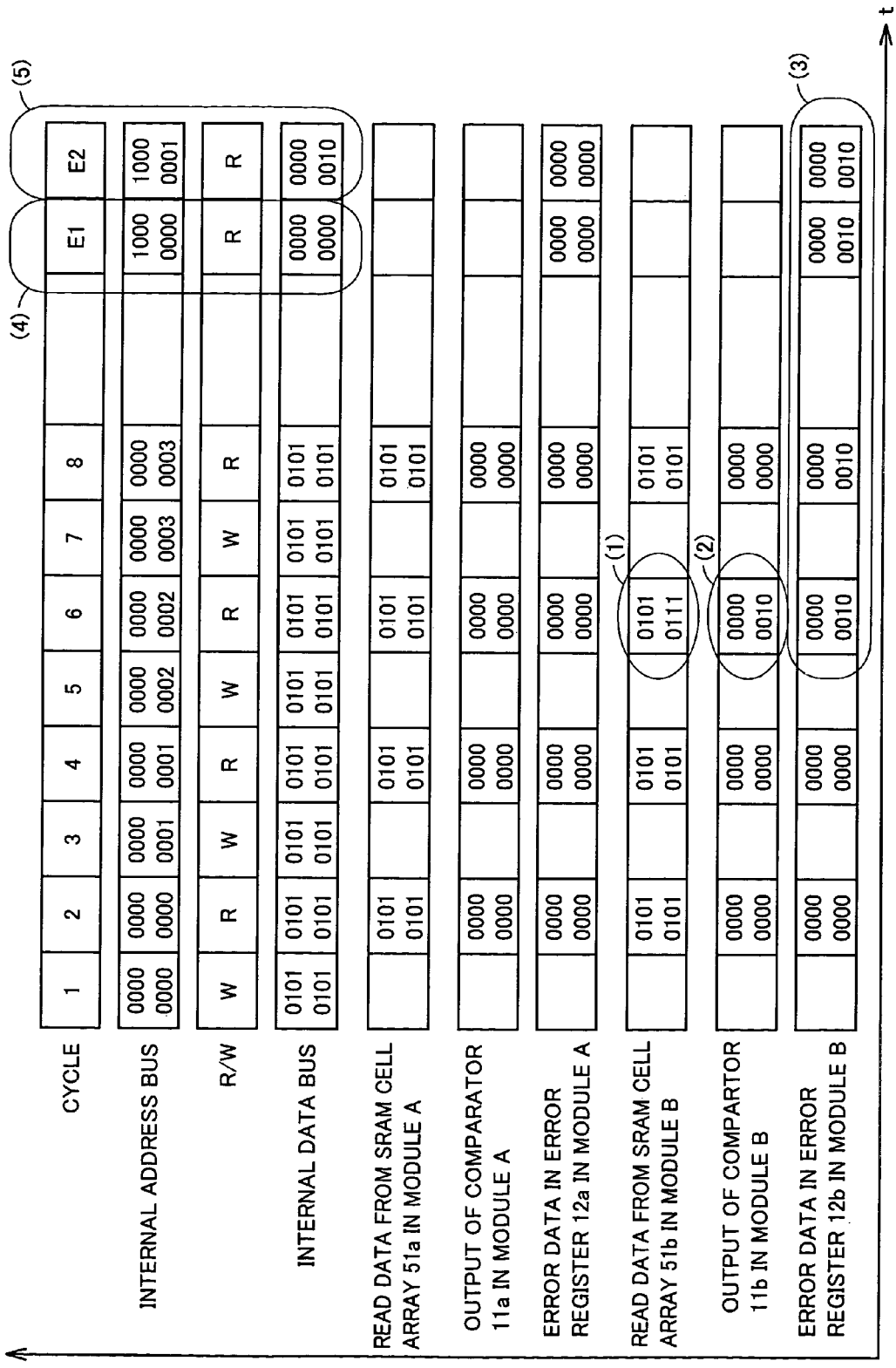
FIG. 6 shows changes of a variety of signals over time in connection with a test operation.

Referring to FIG. 6 showing the changes of a variety of signals over time in connection with the test operation, an operation of semiconductor integrated circuit 100 in a test mode will be described.

First, every one cycle, a write/read control signal R/W changes such that writing and reading are performed alternately.

In a write cycle, when a row address signal is input through the internal address bus, a word line corresponding to that row address is activated.

Then, a value of a corresponding bit of 32-bit test data 32'h0101 0101 input through the internal data bus is written into each memory cell connected to the activated word line.

Then, in a read cycle, the same row address as the row address applied in the immediately preceding write cycle is provided, and the word line corresponding to that row address is activated.

Data from all of the 32 memory cells connected to the activated word line is output as 32-bit read data.

Here it is assumed that in module A the same data as the written test data is always output as the read data. In other words, it is assumed that the read data is always 32'h0101 0101.

Comparator 11a in module A makes a comparison between an expected value, that is, the written test data and the read data. In module A, since the same data as the written test data is output as the read data, the comparison result indicates equality.

Comparator 11a in module A outputs to error register 12a of module A as error data, 32-bit data 32'h0000 0000 indicating that there is no bit line pair causing an error.

On the other hand, it is assumed that in module B data different from the written test data is output as the read data when the row address is 32'h0000 0002 (indicated by (1) in FIG. 6).

Comparator 11b in module B makes a comparison between an expected value, that is, the written test data and the read data. In module B, since the different data from the written test data is output as the read data, the comparison result indicates difference.

Comparator 11b in module B outputs 32-bit data specifying a bit line pair causing an error, that is, 32'h0000 0010, as error data (indicated by (2) in FIG. 6).

If once a bit takes a value of "1", error register 12b of module B holds this value (indicated by (3) in FIG. 6).

After the process described above has been performed on all of the row addresses, when address signal 32'h1000 0000 is input through the internal address bus, specifying reading of the error data held in error register 12a of module A, address decoder 13a and tristate buffer 14a of module A allows the error data held in error register 12a of module A to be output through the internal data bus and external bus I/F outside the device (as indicated by (4) in FIG. 6).

When address signal 32'h1000 0001 is input through the internal address bus, specifying reading of the error data held in error register 12b of module B, address decoder 13b and tristate buffer 14b of module B allows the error data held in error register 12b of module B to be output through the internal data bus and external bus I/F outside the device (as indicated by (5) in FIG. 6).

As described above, in the semiconductor integrated circuit in accordance with the present embodiment where it includes a plurality of modules, 32-bit error data indicating whether there is an error in 32 columns is held in error registers 12a, 12b, so that a test can be performed that allows all the columns including the memory cells causing errors to be specified even when the number of errors is larger than the number of redundancy circuits, without increasing a circuit scale.

Second Embodiment

The present embodiment relates to a memory test in a semiconductor integrated circuit including two banks.

(Configuration)

Figure 7:
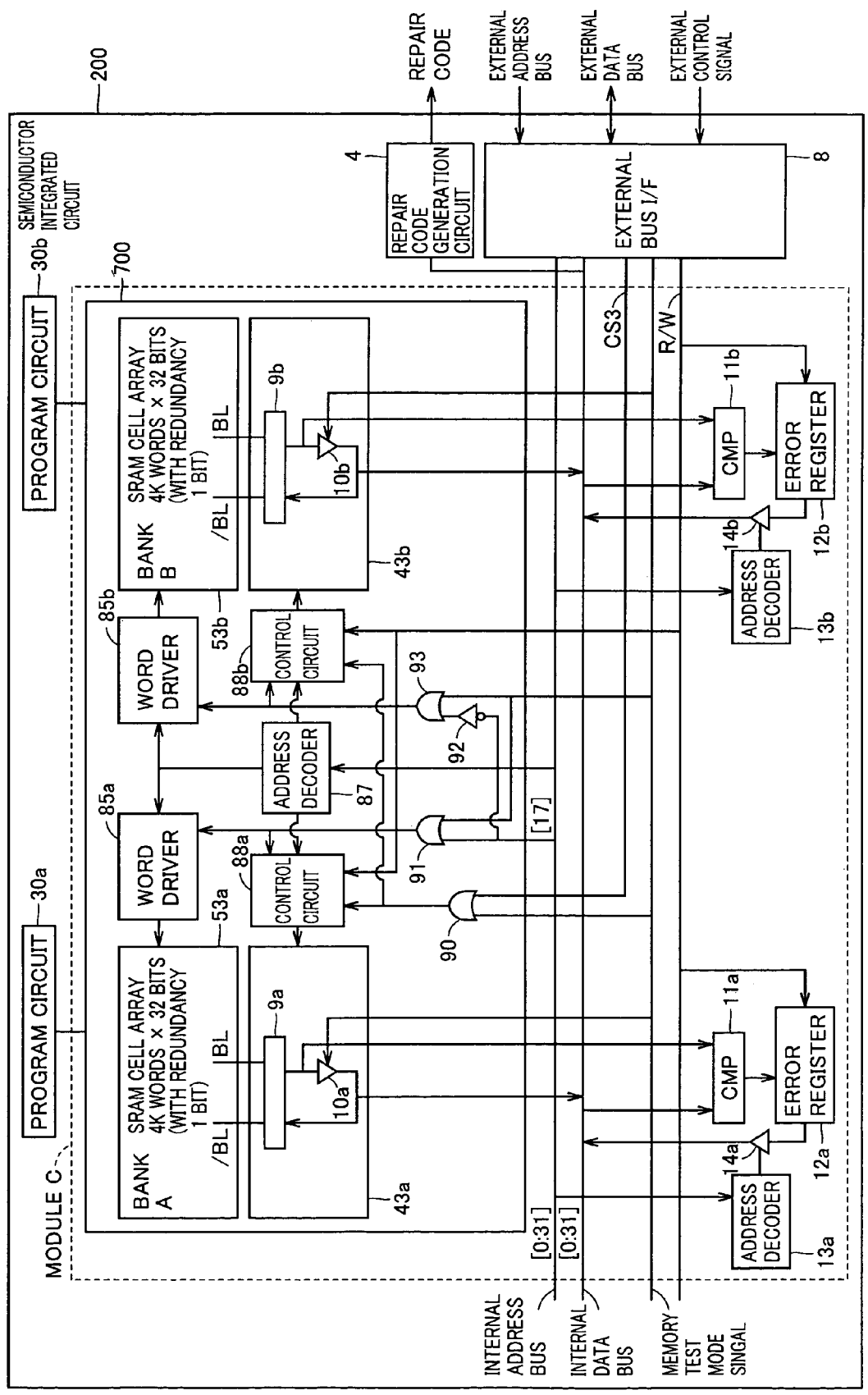
FIG. 7 is a diagram showing a configuration of a semiconductor integrated circuit in accordance with a second embodiment.

FIG. 7 shows a configuration of a semiconductor integrated circuit in accordance with a second embodiment. Referring to FIG. 7, a semiconductor integrated circuit 200 has two banks A and B. Bank A is formed of SRAM cell arrays 53a and bank B is formed of SRAM cell arrays 53b. Two banks A and B are connected to a common internal address bus and a common internal data bus. Two banks A and B have their operations controlled by the 17th bit of an address signal in a normal operation mode.

Semiconductor integrated circuit 200 also includes an address decoder 87 and an OR circuit 90 shared by these two banks, gate circuits 43a, 43b, address decoders 13a, 13b, comparators 11a, 11b, error registers 12a, 12b, tristate buffers 14a, 14b, control circuits 81a, 81b, word drivers 85a, 85b, OR circuits 91 and 93, and an inverter 92.

Address decoder 87 is formed of a row decoder and a column decoder.

The row decoder specifies a word line of bank A and bank B to be activated in accordance with a row address formed of a prescribed plurality of bits of an address signal passed through the internal address bus.

The column decoder selects a column of bank A and bank B in accordance with a column address formed of a prescribed plurality of bits of an address signal passed through the internal address bus. The column decoder selects all the columns in a memory test mode.

In the memory test mode, the memory test mode signal is set to "1" (asserted) in accordance with an external control signal. On the other hand, in a normal mode, a chip select signal CS3 is set to "1" (asserted) in accordance with the external control signal, and in addition, the 17th bit of the address signal is set to "1" when bank A is selected, while the 17th bit of the 32-bit address signal is set to "0" when bank B is selected.

OR circuit 90 outputs to control circuits 88a, 88b, a signal to be asserted when the memory test mode signal is "1" (asserted) or chip select signal CS3 is "1" (asserted).

OR circuit 91 outputs to control circuit 88a and word driver 85a a signal to be asserted when the memory test mode signal is "1" (asserted) or the 17th bit of the address signal is "1".

OR circuit 92 outputs to control circuit 88b and word driver 85b a signal to be asserted when the memory test mode signal is "1" (asserted) or the 17th bit of the address signal is "0".

Control circuit 88a controls writing of data into SRAM cell array 53a and reading of data from SRAM cell array 53a. Control circuit 88a allows a data to be written into or read from bank A (SRAM cell array 53a) only when the signal from OR circuit 90 is asserted and the signal from OR circuit 91 is asserted, that is, in the memory test mode or when the chip and bank A is selected in the normal mode. Therefore, in the memory test mode, data is written into or read from bank A (SRAM cell array 53a) irrespective of the 17th bit value of the address signal.

Word driver 85a activates a word line of bank A when the signal from OR circuit 91 is asserted, that is, in the memory test mode or when bank A is selected in the normal mode.

Control circuit 88b controls writing of data into SRAM cell array 53b and reading of data from SRAM cell array 53b. Control circuit 88b allows data to be written into or read from bank B (SRAM cell array 53b) only when the signal from OR circuit 90 is asserted and the signal from OR circuit 93 is asserted, that is, in the memory test mode or when the chip and bank B is selected in the normal mode. Therefore, in the memory test mode, data is written into or read from bank B (SRAM cell array 53b) irrespective of the 17th bit value of the address signal.

Word driver 85b activates a word line of bank B when the signal from OR circuit 93 is asserted, that is, in the memory test mode or when bank B is selected in the normal mode.

Returning to FIG. 7, gate circuits 43a, 43b, address decoders 13a, 13b, comparators 11a, 11b, error registers 12a, 12b, and tristate buffer 14a, 14b are similar to those in the first embodiment. Therefore, also in the semiconductor integrated circuit including two banks A and B, writing and reading of test data can be performed simultaneously on the two banks in the memory test mode.

As described above, in the semiconductor integrated circuit in accordance with the present embodiment where it includes a plurality of banks, 32-bit error data indicating whether there is an error for 32 columns is also held in error registers 12a, 12b, so that a test can be performed that allow all the columns including memory cells causing errors to be specified even when the number of errors is larger than the number of redundancy circuits, without increasing a circuit scale.

Third Embodiment

The present embodiment relates to a semiconductor integrated circuit having a memory test mode function of performing a two-step test.

(Configuration)

Figure 8:
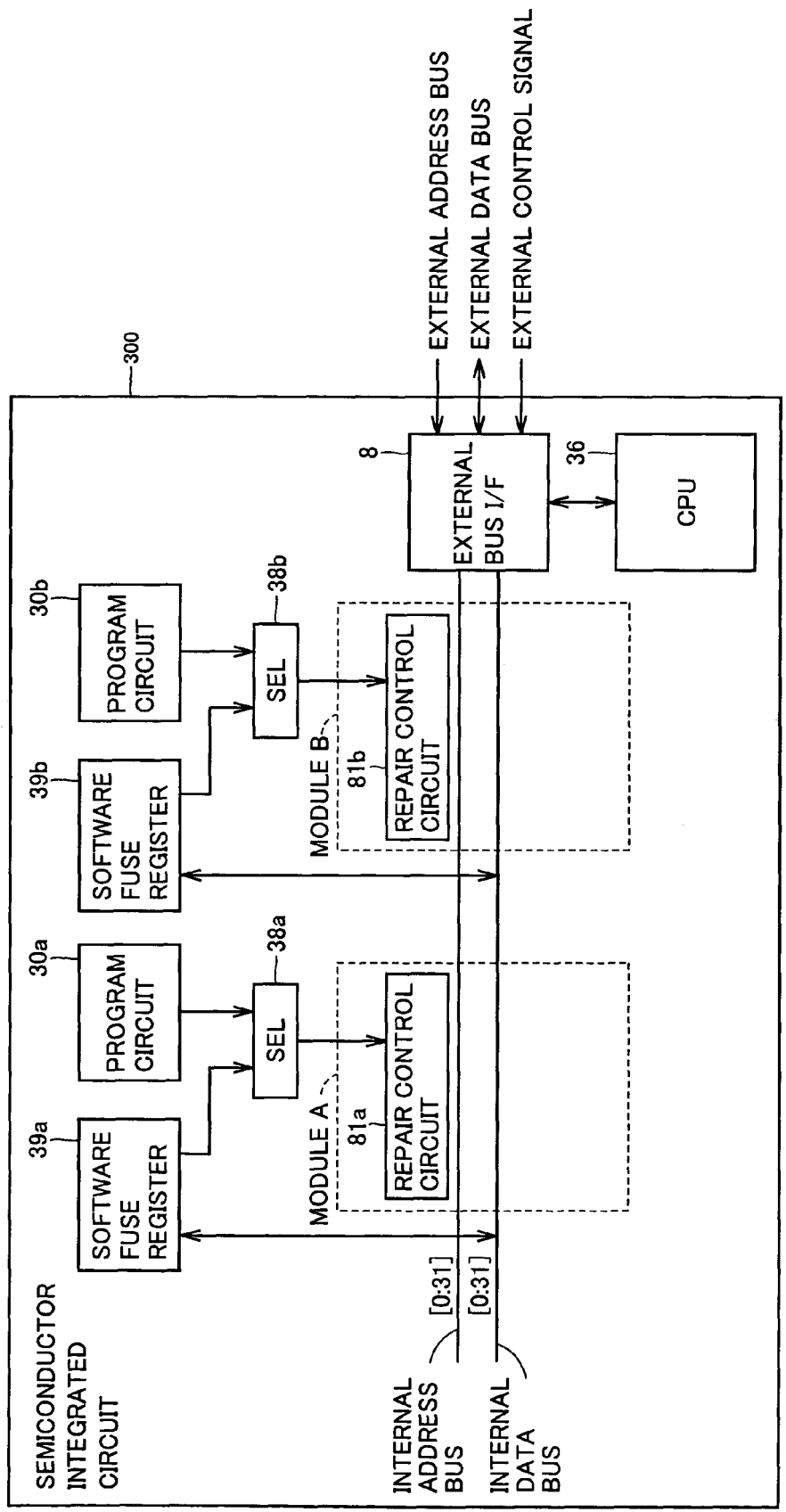
FIG. 8 is a diagram schematically showing a configuration of a semiconductor integrated circuit in accordance with a third embodiment.

FIG. 8 shows a schematic configuration of a semiconductor integrated circuit in accordance with a third embodiment. Referring to FIG. 8, a semiconductor integrated circuit 300 includes a CPU (Central Processing Unit) 36, program circuits 30a, 30b, software fuse registers 39a, 39b, selectors 38a, 38b, and repair control circuits 81a, 81b.

Program circuits 30a, 30b are similar to that described in the first embodiment and output repair codes corresponding to the setting states of the fuses.

A 6-bit repair code generated in CPU 36 is stored in software fuse registers 39a, 39b. Software fuse registers 39a, 39b each hold 6'b000000 as an initial value.

Selectors 38a, 38b select either a repair code output from program circuits 30a, 30b or a repair code output from software fuse registers 39a, 39b to be output to repair control circuits 81a, 81b.

CPU (processor) 36 performs the two-step test using a dedicated test program. More specifically, CPU 36 performs the two-step test by successively generating an address signal and a control signal on its own in accordance with the dedicated test program for controlling the components within semiconductor integrated circuit 300, rather than relying on an externally applied address signal and control signal.

In each step of the test, CPU 36 successively activates all the word lines within modules A and B to allow test data to be written, and thereafter successively activates all the word lines within modules A and B to allow test data to be read. In other words, CPU 36 generates all the control signals and address signals required for writing and reading of the test data and provides these signals to the related components.

At the first step of the test, CPU 36 does not allow the repair processing in repair control circuits 81a, 81b. If there is no error as a result of the first step of the test, CPU 36 provides a notification to the outside of the device that there is no need for repair. If there is an error, CPU 36 allows the repair code to be stored in software fuse registers 39a, 39b.

At the second step of the test, CPU 36 allows selectors 38a, 38b to select the repair code output from software fuse registers 39a, 39b for output to repair control circuits 81a, 81b, and then allows repair control circuits 31a, 31b to output a spare selector control signal corresponding to that repair code for the repair processing. If there is any error as a result of the test on the second step, CPU 36 provides a notification to the outside of the device that the repair has not been performed sufficiently. If there is no error, CPU 36 outputs the repair code to the outside as it has been verified that the repair has been performed sufficiently with that repair code.

After each fuse element of program circuits 30a, 30b has been set to output the repair code which has been verified that repair is sufficiently performed, CPU 36 allows selectors 38a, 38b to select a repair code output from program circuit 30a, 30b for output to repair control circuits 81a, 81b and then allows repair control circuits 81a, 81b to output a spare select control signal corresponding to that repair code for repair processing, in writing and reading data into and from modules A and B.

(Operation)

Figure 9:
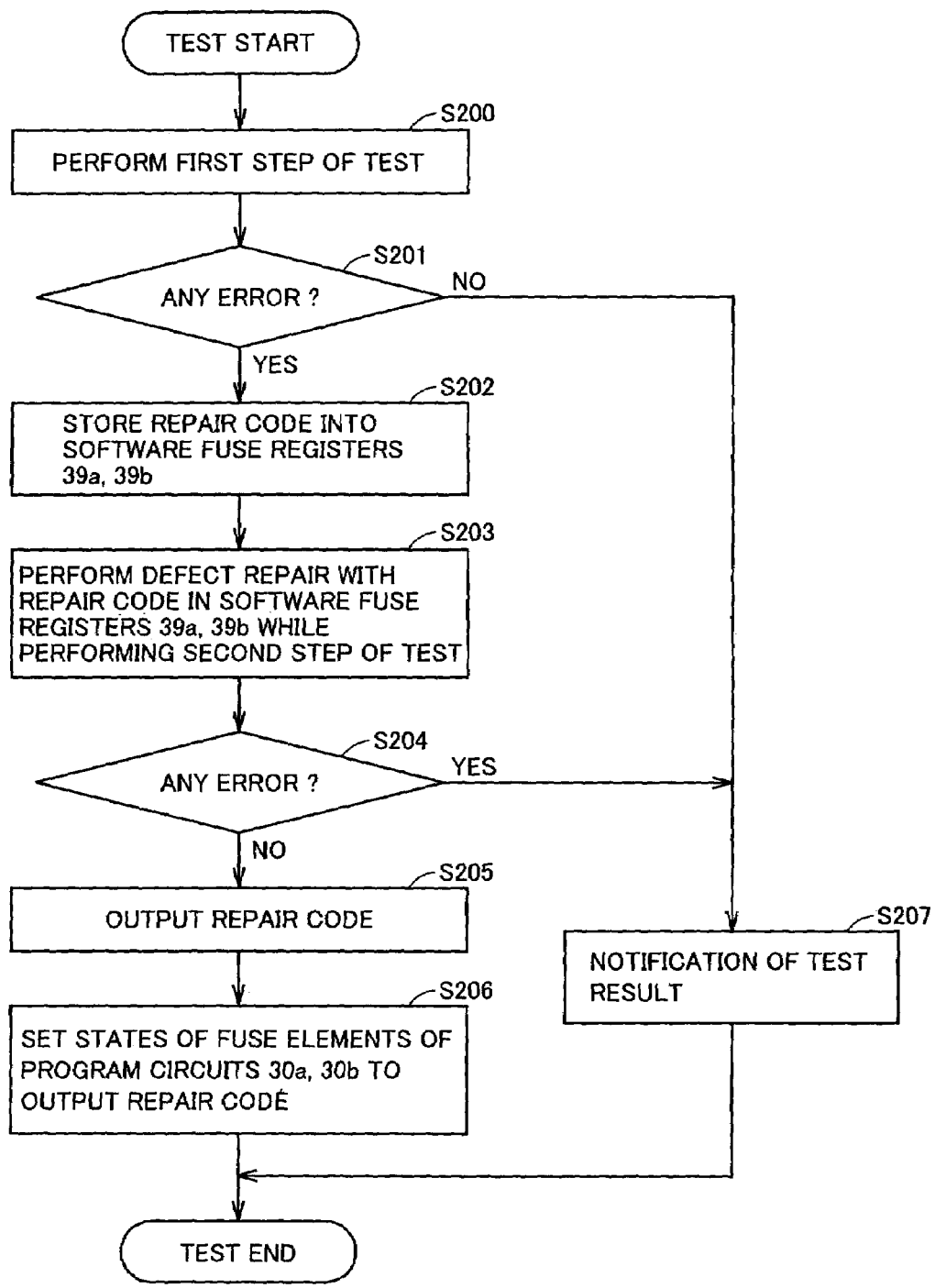
FIG. 9 is a flow chart showing an operation procedure of a test process in the third embodiment.

Referring to the flow chart shown in FIG. 9, an operation of semiconductor integrated circuit 300 will be described.

First, CPU 36 causes semiconductor integrated circuit 300 to perform the first step of the test. In other words, CPU 36 allows test data to be written into modules A and B and allows test data to be read from modules A and B. In the first step of the test, the repair processing in repair control circuits 81a, 81b is not allowed (step S200).

As a result of the first step of the test, the error data held in error registers 12a, 12b is sent to CPU 36, and CPU 36 generates a repair code. When the generated repair code is 6'b000000, that is, when there is no error, CPU 36 provides a notification to the outside of the device that there is no need for repair (steps S201, S207).

On the other hand, when the generated repair code is not 6'b000000, that is, when there is an error, CPU 36 allows the repair code to be stored in software fuse register 39a or 39b in the corresponding module (steps S201, S202).

Next, CPU 36 causes semiconductor integrated circuit 300 to perform the second step of the test. More specifically, CPU 36 allows test data to be written into modules A and B and allows test data to be read from modules A and B. In the second step of the test, CPU 36 allows selectors 38a, 38b to select a repair code output from software fuse registers 39a, 39b for and output to repair control circuits 81a, 81b. In repair control circuits 81a, 81b, the repair processing is performed by outputting a spare selector control signal corresponding to that repair code (step S203).

Then, as a result of the second step of the test, the error data held in error registers 12a, 12b is sent to CPU 36, and CPU 36 generates a repair code. When the generated repair code is not 6'b000000, that is, when there is an error, CPU 36 provides a notification to the outside of the device that the repair has not been performed sufficiently (steps S204, S207).

On the other hand, when the generated repair code is 6'b000000, that is, when there is no error, CPU 36 outputs the repair code to the outside as it has been verified that the repair has been performed sufficiently with that repair code (step S205).

Each fuse element of program circuit 30a, 30b is set to output the repair code. In the subsequent data writing into and reading from modules A and B, CPU 36 allows selectors 38a, 38b to select a repair code output from program circuits 30a, 30b for output to repair control circuits 81a, 81b. In repair control circuits 81a, 81b, the repair processing is performed by outputting a spare selector control signal corresponding to the repair code (step S206).

As described above, in the semiconductor integrated circuit in accordance with the present embodiment, software fuse registers 39a, 39b store the repair code generated as a result of the first step of the test, and it is verified in the second step of the test whether the repair code within software fuse registers 39a, 39b enables the repair. The fuse element within program circuits 30a, 30b is set only after it has been verified that the repair is enabled. Therefore, it is possible to prevent erroneously disconnection of the fuse element.

<Modification>

The present invention is not limited to the embodiment described above and includes the following modifications, for example.

Although it has been described in the first embodiment that SRAM cell arrays within two modules have different sizes, SRAM cell arrays within two modules may have the same size.

Furthermore, although it has been described in the second embodiment that two banks (SRAM cell arrays) have the same size, the present invention is not limited thereto and two banks (SRAM cell arrays) may have different sizes. In the case of different sizes, as in the first embodiment, for example, there is a need for a circuit that allows a reading or writing operation on a bank having a smaller size only when the 18th and 19th bits of the address signal are set to "00", and that does not allow a reading or writing operation when the 18th and 19th bits of the address signal are set to "01", "10", or "11".

Although the present invention has been described and illustrated in detail, it is clearly understood that the same is by way of illustration and example only and is not to be taken byway of limitation, the spirit and scope of the present invention being limited only by the terms of the appended claims.

What is claimed is:

1. A semiconductor integrated circuit comprising:
   a plurality of modules having their operations controlled by respective chip select signals, wherein
   each of said modules has a plurality of memory cells;
   each of said modules has a control circuit controlling an operation of reading or writing data from or into said memory cell, respectively,
   said plurality of modules receive a common address signal sent through a common internal address bus,
   said plurality of modules have a different number of word lines from each other such that one of said plurality of modules has a finite maximum number of word lines, and
   said control circuit included in one of said modules that does not have the maximum number of word lines among said plurality of modules controls an operation of reading or writing data from or to said memory cell in a test mode, irrespective of a value of said chip select signal, only when values of one or more prescribed bits forming an address signal are prescribed values.

2. The semiconductor integrated circuit according to claim 1 further comprising:
   a comparator comparing a value of data read from each memory cell connected to an activated word line with an expected value to be read from said each memory cell, for each column in a test mode; and
   an error register accumulatively holding error data based on a comparison result by said comparator, wherein
   each bit of said error data indicates a comparison result by said comparator for a corresponding column, and
   said each bit takes a first logical value when said comparison result for said corresponding column always indicates equality whichever word line is activated, and takes a second logical value when once said comparison result for said corresponding column indicates difference.

3. The semiconductor integrated circuit according to claim 1, wherein said semiconductor integrated circuit has a redundancy circuit in a column.

4. The semiconductor integrated circuit according to claim 3, wherein said error register outputs held error data when an address signal indicates a prescribed value,
   said semiconductor integrated circuit further comprises a repair code generation circuit receiving said error data for generating a repair code for repairing a defective memory cell array using said redundancy circuit.

5. The semiconductor integrated circuit according to claim 4 comprising:

a program circuit including at least one fuse element for outputting a repair code corresponding to a state of said fuse element;

a register holding a repair code;

a selector selecting and outputting one of the repair code output from said program circuit and the repair code output from said register; and a repair control circuit controlling repair of a defective memory cell array in accordance with the repair code output from said selector.

6. The semiconductor integrated circuit according to claim 3 comprising:

a program circuit including at least one fuse element for outputting a repair code corresponding to a state of said fuse element;

a register holding a repair code;

a selector selecting and outputting one of the repair code output from said program circuit and the repair code output from said register;

a repair control circuit controlling repair of a defective memory cell array in accordance with the repair code output from said selector; and a processor controlling an execution of a two-step test, wherein said processor controls writing of test data into a memory cell and reading of test data from a memory cell without causing said repair control circuit to perform repair in a first step of the test, generates a repair code corresponding to error data stored in said error register in said first step of the test for storage into said register, and controls writing of test data into a memory cell and reading of test data from a memory cell while allowing said selector to output the repair code from said register to cause said repair control circuit to perform the repair.

7. The semiconductor integrated circuit according to claim 1, wherein said prescribed bits are used in specifying a word line of a module having a maximum number of word lines and are not used in specifying a word line of said module that does not have a maximum number of word lines.

* * * * *